(12) United States Patent
Cho

(10) Patent No.: US 6,833,748 B2
(45) Date of Patent: Dec. 21, 2004

(54) VOLTAGE SUPPLY CIRCUIT FOR ACTIVE AND STANDBY MODE VOLTAGES

(75) Inventor: Yong Deok Cho, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/287,782

(22) Filed: Nov. 5, 2002

(65) Prior Publication Data

US 2003/0102903 A1 Jun. 5, 2003

(30) Foreign Application Priority Data

Dec. 4, 2001 (KR) .................................. 10-2001-76185

(51) Int. Cl.[7] .............................................. H03K 17/04
(52) U.S. Cl. ....................... 327/374; 327/534; 327/544; 713/323
(58) Field of Search ................................. 327/374, 530, 327/534, 544; 326/17; 365/227; 713/323, 324

(56) References Cited

U.S. PATENT DOCUMENTS

| | | | | |
|---|---|---|---|---|
| 6,049,245 A | * | 4/2000 | Son et al. ................... | 327/544 |
| 6,326,837 B1 | * | 12/2001 | Matano ...................... | 327/545 |
| 6,404,232 B1 | * | 6/2002 | Mizuno et al. ............. | 327/534 |
| 6,518,825 B2 | * | 2/2003 | Miyazaki et al. ........... | 327/534 |
| 6,559,708 B2 | * | 5/2003 | Notani ....................... | 327/534 |

* cited by examiner

Primary Examiner—Timothy P. Callahan
Assistant Examiner—Terry L. Englund
(74) Attorney, Agent, or Firm—Piper Rudnick LLP

(57) ABSTRACT

A voltage supply circuit is capable of improving an operating speed of the circuit while lowering power consumption. An internal power supply voltage that is dropped and an internal ground voltage that is raised, from an external power supply, are generated and then supplied to an internal circuit. Therefore, when the circuit is driven, a swing width of a signal is reduced to reduce a dynamic power. When the internal circuit is driven at a low voltage, the back bias of a transistor is varied to lower the threshold voltage. Thus, the operating speed can be improved. Also, in a standby mode, the threshold voltage is increased to minimize the amount of current flowing at a sub-threshold voltage below the threshold voltage, thus reducing a static power.

9 Claims, 4 Drawing Sheets

US 6,833,748 B2

VOLTAGE SUPPLY CIRCUIT FOR ACTIVE AND STANDBY MODE VOLTAGES

BACKGROUND OF THE INVENTION

1. Field of the Invention

The invention relates generally to a voltage supply circuit, and more particularly to, a voltage supply circuit capable of improving the operating speed while lowering a static power.

2. Description of the Prior Art

FIG. 1 is a circuit diagram of a conventional voltage supply circuit.

As shown in FIG. 1, the voltage supply circuit includes a standby mode bias supply unit 120 for controlling a high voltage level power supply voltage VEXT externally applied to be a high voltage level standby power supply voltage VDD of a given level, depending on a standby control signal STA for a standby operation in a standby mode, and then supplying the controlled voltage to an internal circuit 100; and an active mode bias supply unit 130 for controlling the high voltage level power supply voltage VEXT externally applied to be an active mode power supply voltage $V_{AH}$ having a lower level than a standby mode power supply voltage $V_{SH}$ depending on an active control signal ACT for a normal operation in an active node and then supplies the controlled voltage to the internal circuit 100.

The standby mode bias supply unit 120 includes a switching means S11 connected between a terminal of the external high voltage level power supply voltage VEXT and a high voltage level power supply voltage node Q11 of the internal circuit 100 being an output terminal, and a compare means A11 for comparing a voltage of the high voltage level power supply voltage node Q11 and a high voltage level reference voltage $V_{refSH}$ of a standby mode to control the switching means S11, depending on the standby control signal STA.

The active mode bias supply unit 130 includes a switching means S12 connected between the terminal of the external high voltage level power supply voltage VEXT and the high voltage level power supply voltage node Q11 of the internal circuit 100 being the output terminal, and a compare means A12 for comparing the voltage of the high voltage level power supply voltage node Q11 and the high voltage level reference voltage $V_{refAH}$ of an active mode to control the switching means S12, depending on the active control signal ACT.

A capacitor C11 for preventing a riffle phenomenon is connected between the high voltage level power supply voltage node Q11 and the terminal of an external low voltage level power supply voltage.

In a standby mode, the voltage supply circuit constructed above controls the external high voltage level power supply voltage VEXT to be a standby mode voltage $V_{SH}$ of a high voltage level depending on the standby control signal STA and then applies the controlled voltage to the internal circuit 100 via the high voltage level power supply voltage node Q11. At this time, the standby mode voltage $V_{SH}$ is also applied to a well region in which a transistor is formed, via the first back bias terminal Q12 of the internal circuit 100.

In an active node, the voltage supply circuit controls the high voltage level power supply voltage VEXT to be the active mode power supply voltage $V_{AH}$ of a high voltage level that is lower than the high voltage level power supply voltage $V_{refSH}$ of a standby mode, depending on the active control signal ACT, and then applies the controlled voltage to the internal circuit 100 through the high voltage level power supply voltage node Q11. At this time, the active mode power supply voltage $V_{AH}$ is also applied to a well region in which a PMOS transistor is formed, via the first back bias terminal Q12 of the internal circuit 100.

The external low voltage level power supply voltage VSS is applied to the internal circuit 100 through the low voltage level power supply voltage node Q13 and is also applied to a well region in which a NMOS transistor is formed via a second back bias terminal Q14 of the internal circuit 100.

The internal circuit 100 generates a plurality of output signals OUT1~OUTn depending on a plurality of input signals IN1~INn. The output signal only OUT1 shown in the drawing is outputted as an output signal Tx that is stabilized through the output buffer 110 having a PMOS transistor P11 and a NMOS transistor N11.

In the standby mode, the output buffer 110 employs the standby power supply voltage $V_{SH}$ of the high voltage level and an external low voltage level power supply voltage $V_{SS}$, which are applied through the high voltage level power supply voltage node Q11 and the third node Q13, as the power supply. At this time, the standby power supply voltage $V_{SH}$ is applied to the well region in which the PMOS transistor P11 is formed via the first back bias node Q12. Also, the external low voltage level power supply voltage $V_{SS}$ is applied to the well region in which the NMOS transistor N11 is formed via the second back bias node Q14.

Further, in the active node, the output buffer 110 employs the active power supply voltage $V_{AH}$ of the high voltage level and the external low voltage level power supply voltage $V_{SS}$, which are applied through the high voltage level power supply voltage node Q11 and the third node Q13, as the power supply. At this time, the active power supply voltage $V_{AH}$ is applied to the well region in which the PMOS transistor P11 is formed via the first back bias node Q12. Also, the external low voltage level power supply voltage $V_{SS}$ is applied to the well region in which the NMOS transistor N11 is formed via the second back bias node Q14.

As described, the conventional voltage supply circuit controls the external high voltage level power supply voltage VEXT to be the standby power supply voltage $V_{SH}$ or the active power supply voltage $V_{AH}$ of the high voltage level in order to use the controlled voltage as the power supply, and also uses the external low voltage level power supply voltage $V_{SS}$ intact.

Due to this, there is a problem that noise due to ground bouncing is increased depending on a switching operation of the internal circuit 100. In addition, as the back bias voltage applied to the transistor of the internal circuit 100 is fixed, the threshold voltage could not be varied using a body effect.

Therefore, in order to use the body effect, it is required that the concentration of doping in a process of manufacturing a transistor having a low threshold voltage be lowered. For this purpose, there are problems that additional mask is required, the number of process is increased and the production cost is increased.

SUMMARY OF THE INVENTION

The present invention is contrived to solve the above problems and an object of the present invention is to provide a voltage supply circuit capable of reducing a dynamic power, compensating for an operating speed and reducing a static power, in a way that a swing width of a signal is made small when the circuit is driven by together applying an internal power supply voltage dropped from an external power supply and a raised internal ground voltage to an internal circuit, a threshold voltage is lowered by varying a back bias of a transistor when the internal circuit is driven at a low voltage, and the amount of current flowing at a voltage of below a sub-threshold voltage is minimized by raising the threshold voltage in a standby mode.

In order to accomplish the above object, a voltage supply circuit according to the present invention, is characterized in that it comprises a circuit that operates separately in a standby mode and in an active mode, a standby mode bias supply unit that controls each of an external high voltage level power supply voltage and an external low voltage level power supply voltage to be a given voltage level, depending on a standby control signal if the circuit is in the standby mode, and then supplying the controlled voltage to the circuit; and an active mode bias supply unit that reduces the width of the level between the external high voltage level power supply voltage and the external low voltage level power supply voltage, depending on an active control signal if the circuit is in the active mode, and then supplies the voltage to the circuit.

Meanwhile, the voltage supply circuit further comprises a first back bias application unit for applying either the high voltage level power supply voltage externally applied or the active power supply voltage of a high voltage level generated from the active mode bias supply unit to a back bias terminal of a PMOS transistor of the internal circuit, depending on an inverted standby control signal and an inverted active control signal, and a second back bias application unit for applying either the low voltage level power supply voltage externally applied and the active power supply voltage of a low voltage level generated from the active mode bias supply unit to a back bias terminal of a NMOS transistor of the internal circuit, depending on the standby control signal and the active control signal.

Also, the voltage supply circuit comprises a level shifter for controlling the output signal of the internal circuit to be a power supply voltage of a receiving circuit in the active node, and then applying the signal to the receiving circuit.

BRIEF DESCRIPTION OF THE DRAWINGS

The aforementioned aspects and other features of the present invention will be explained in the following description, taken in conjunction with accompanying drawings, wherein.

DETAILED DESCRIPTION OF PREFERRED EMBODIMENTS

Figure 1:
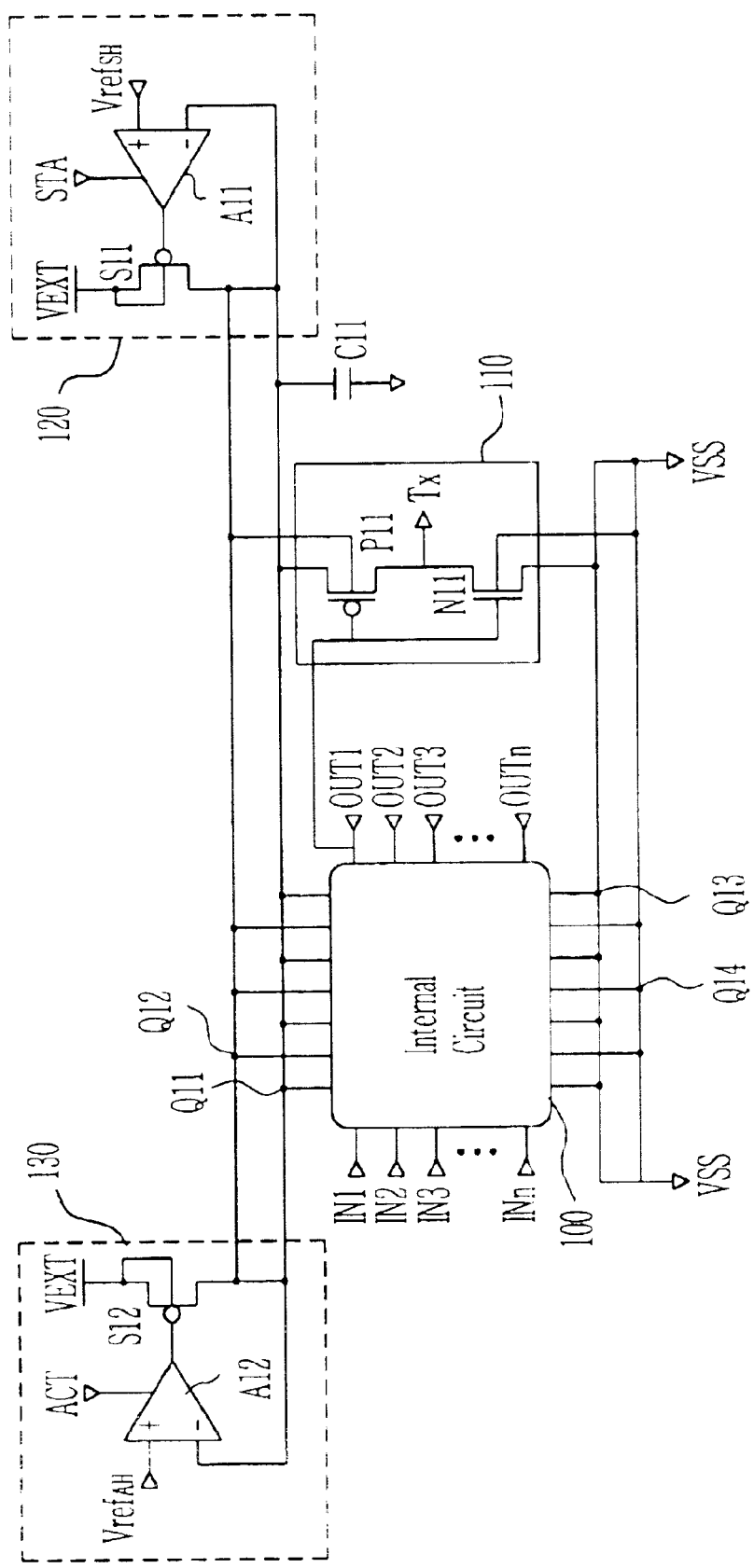
FIG. 1 is a circuit diagram of a conventional voltage supply circuit.

The present invention will be described in detail by way of a preferred embodiment with reference to accompanying drawings, in which like reference numerals are used to identify the same or similar parts.

Figure 2:
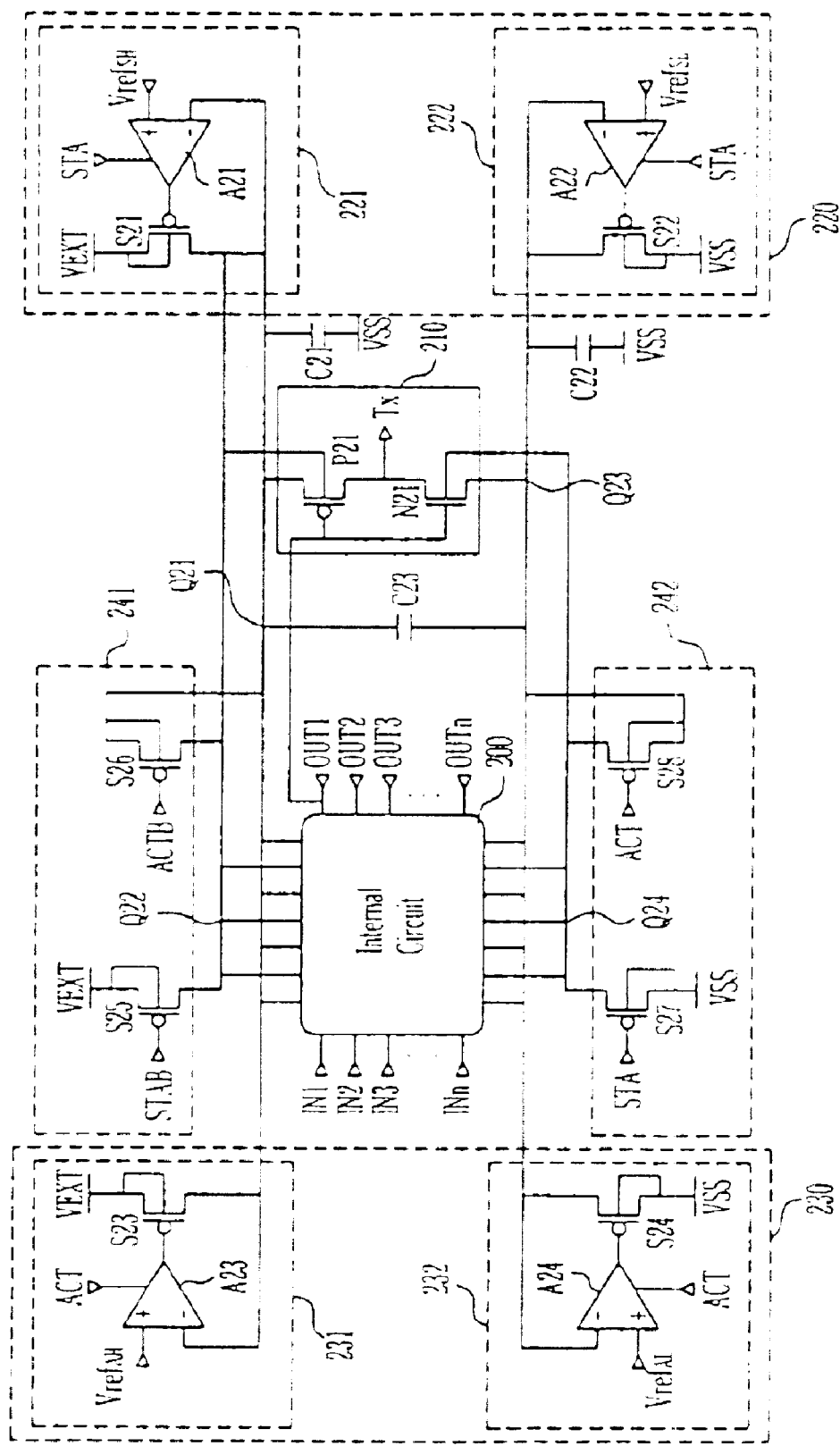
FIG. 2 is a circuit diagram of a voltage supply circuit according to the present invention.

FIG. 2 is a circuit diagram of a voltage supply circuit according to the present invention. A construction of the voltage supply circuit will be described by reference to FIG. 2.

As shown in FIG. 2, the voltage supply circuit of the present invention includes a standby mode bias supply unit 220 for supplying standby power supply voltages $V_{SH}$ and $V_{SL}$ of a high voltage level and a low voltage level, respectively, to an internal circuit 200 through a high voltage level power supply voltage node Q21 and a low voltage level power supply voltage node Q23 in a standby mode; and an active mode bias supply unit 230 for supplying active power supply voltages $V_{AH}$ and $V_{AL}$ of a high voltage level and a low voltage level, respectively, to the internal circuit 200 in an active node.

The standby mode bias supply unit 220 includes a high voltage level bias supply unit 221 for generating the standby power supply voltage $V_{SH}$ of the high voltage level and then applying it to the internal circuit 200, and a low voltage level bias supply unit 222 for generating the standby power supply voltage $V_{SL}$ of the low voltage level and then applying it to the internal circuit 200.

The high voltage level bias supply unit 221 includes a switching means S21 connected between a terminal of an external high voltage level power supply voltage VEXT and the high voltage level power supply voltage node Q21 of the internal circuit 200 being an output terminal, and a compare means A21 for comparing a voltage of the high voltage level power supply voltage node Q21 and the high voltage level reference voltage $V_{refSH}$ of a standby mode to control the switching means S21, depending on the standby control signal STA.

The low voltage level bias supply unit 222 includes a switching means S22 connected between a terminal of an external low voltage level power supply voltage $V_{SS}$ and a low voltage level power supply voltage node Q23 of the internal circuit 200 being an output terminal, and a compare means A22 for comparing a voltage of the low voltage level power supply voltage node Q23 and the low voltage level reference voltage $V_{refSL}$ of a standby mode to control the switching means S22, depending on the standby control signal STA.

The active mode bias supply unit 230 includes a high voltage level bias supply unit 231 for generating the active power supply voltage $V_{AH}$ of a high voltage level and then applying it to the internal circuit 200, and a low voltage level bias supply unit 232 for generating an active power supply voltage $V_{AL}$ of a low voltage level and then applying it to the internal circuit 200.

The high voltage level bias supply unit 231 includes a switching means S23 connected between the terminal of the external high voltage level power supply voltage VEXT and the high voltage level power supply voltage node Q21 of the internal circuit 200 being an output terminal, and a compare means A23 for comparing the voltage of the high voltage level power supply voltage node Q21 and the high voltage level reference voltage $V_{refAH}$ of an active mode to control the switching means S23, depending on an active control signal ACT. At this time, the high voltage level reference voltage $V_{refAH}$ of the active mode is lower than the high voltage level reference voltage $V_{refSH}$ of the standby mode.

The low voltage level bias supply unit 232 includes a switching means S24 connected between the terminal of the external low voltage level power supply voltage $V_{SS}$ and the low voltage level power supply voltage node Q23 of the internal circuit 200 being an output terminal, and a compare means A24 for comparing the voltage of the low voltage level power supply voltage node Q23 and the low voltage level reference voltage $V_{refAL}$ of the active mode to control a switching means S24, depending on the active control signal ACT. At this time, the low voltage level reference voltage $V_{refAL}$ of the active mode is higher than the low voltage level reference voltage $V_{refSL}$ of the standby mode.

First and second capacitors C21 and C22 are connected to the high voltage level power supply voltage node Q21 and the low voltage level power supply voltage node Q23 in the internal circuit 200, respectively, in order to prohibit a riffle phenomenon. Meanwhile, a third capacitor C23 is connected between the high voltage level power supply voltage node Q21 and the low voltage level power supply voltage node Q23. Thus, as the third capacitor C23 is operated as a common mode in the active node, the difference in the voltage between the active power supply voltage $V_{AH}$ of the high voltage level and the active power supply voltage $V_{AL}$ of the low voltage level is maintained to be constant, so that reliability of the circuit can be improved.

With the above construction, the active power supply voltage $V_{AH}$ of the high voltage level is generated as a voltage having a level lower than the standby power supply voltage $V_{SH}$ of the high voltage level. Also, the active power supply voltage $V_{AL}$ of the low voltage level is generated as a voltage having a level higher level than the standby power supply voltage $V_{SL}$ of the low voltage level. Therefore, the width of the voltage between the active power supply voltage $V_{AH}$ of the high voltage level the active power supply voltage $V_{AL}$ of the low voltage level, which are generated from the active mode bias supply unit 230, is smaller than those between the standby power supply voltage $V_{SH}$ of the high voltage level and the standby power supply voltage $V_{SL}$ of the low voltage level, which are generated from the standby mode bias supply unit 220.

The voltage supply circuit constructed above further includes a back bias application unit having a first back bias application unit 241 for selectively applying the external high voltage level power supply voltage VEXT or the active power supply voltage $V_{AH}$ of the high voltage level to a well region in which a PMOS transistor of the internal circuit 200 is formed, through the first back bias node Q22, depending on an inverted standby control signal STAB and an inverted active control signal ACTB; and a second back bias application unit 242 for selectively applying the external low voltage level power supply voltage VSS or the active power supply voltage $V_{AL}$ of the low voltage level to a well region in which a NMOS transistor of the internal circuit 200 is formed, through the second back bias node Q24, depending on the standby control signal STA and the active control signal ACT.

The first back bias application unit 241 includes a fifth switching means S25 connected between the first back bias terminal Q22 connected to the well region of the PMOS transistor and the terminal of the external high voltage level power supply voltage and driven by the inverted standby control signal STAB, and a sixth switching means S26 connected between the first back bias terminal Q22 and the high voltage level bias supply unit 231 of the active mode bias supply unit 230 and driven by the inverted active control signal ACTB.

The second back bias application unit 242 includes a seventh switching means S27 connected between a second back bias terminal Q24 connected to the well region of the NMOS transistor and the terminal of the external low voltage level power supply voltage and driven by the standby control signal STA, and an eighth switching means S28 connected between the second back bias terminal Q24 and the low voltage level bias supply unit 232 of the active mode bias supply unit 230 and driven by the active control signal ACT.

The internal circuit generates a plurality of output signals OUT1~OUTn depending on a plurality of input signals IN1~INn. Only output signal OUT1 shown in the drawing is outputted as an output signal Tx that is stabilized through the output buffer 210 having a PMOS transistor P21 and an NMOS transistor N21.

Figure 3:
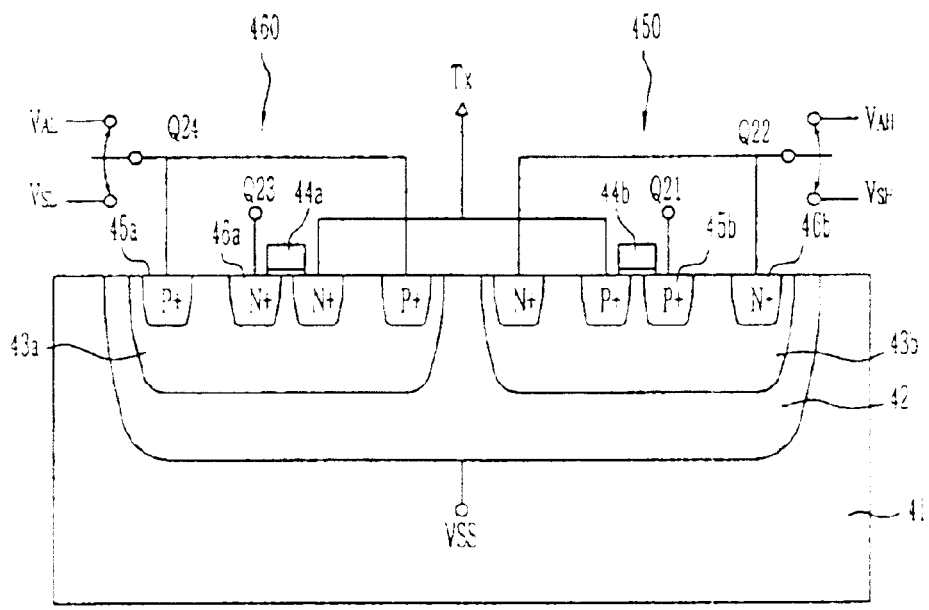
FIG. 3 is a cross sectional view of a transistor for explaining a state that a back bias is applied to the transistor.

Referring now to FIG. 3, a state that the back bias is applied to the PMOS transistor and the NMOS transistor of the internal circuit will be described.

As shown in FIG. 3, a triple n well 42 is formed at the semiconductor substrate 41. A p well 43a and a n well 43b are formed at given regions of the triple n well 42.

A PMOS transistor 450 having a gate electrode 44b and a p type impurity region 45b being source/drain is formed at the n well 43b. Also, a n type impurity region 46b is formed at the n well 43b. The n type impurity region 46b is connected to the high voltage level power supply voltage node Q22 in FIG. 2 to selectively apply the standby power supply voltage $V_{SH}$ of the high voltage level or the active power supply voltage $V_{AH}$ of the high voltage level to the n well 43b. The threshold voltage of the PMOS transistor 450 is varied depending on the voltage applied to the n well 43b.

Meanwhile, a NMOS transistor 460 having the gate electrode 44a and a n type impurity region 46a being source/drain is formed at the p well 43a. Also, the p type impurity region 45a is formed at the p well 43a. The p type impurity region 45a is connected to the low voltage level power supply voltage node Q24 in FIG. 2 to selectively apply the standby power supply voltage $V_{SL}$ of the low voltage level or the active power supply voltage $V_{AL}$ of the low voltage level to the p well 43a. The threshold voltage of the NMOS transistor 460 is varied depending on the voltage applied to the p well 43a.

Figure 4:
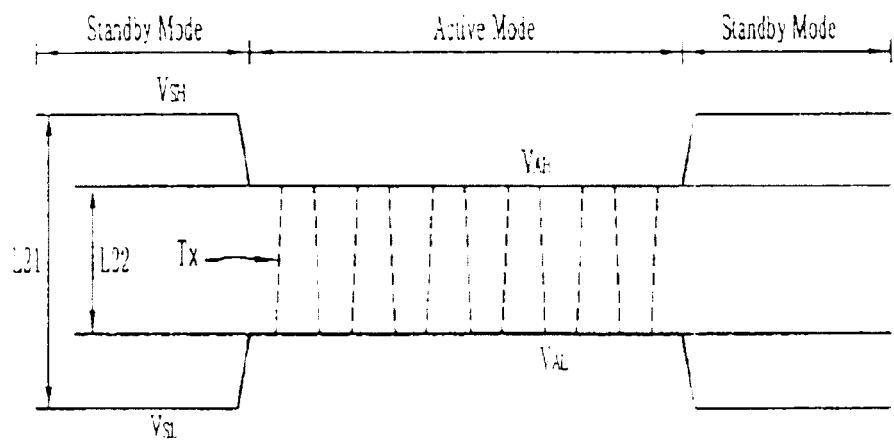
FIG. 4 shows an operating waveform of the voltage supply circuit according to the present invention.

An operation of the voltage supply circuit constructed above will be described by reference to FIG. 4. FIG. 4 shows an operating waveform of the voltage supply circuit according to the present invention.

The operation of the voltage supply circuit in a standby mode will be first described.

In the standby mode, as the standby control signal STA is applied as a HIGH level, the standby mode bias supply unit 220 is driven. Also, as the active control signal ACT is applied as a LOW level, the active mode bias supply unit 230 is not driven.

Next, the high voltage level bias supply unit 221 of the standby mode bias supply unit 220 compares the high voltage level reference voltage $V_{refSH}$ of the standby mode and the voltage of the high voltage level power supply voltage node Q21 in the internal circuit 200 and then controls the switching means S21 to generate the standby power supply voltage $V_{SH}$ of a high voltage. The standby power supply voltage $V_{SH}$ of the high voltage level is then applied to the internal circuit 200 and the output buffer 210 through the high voltage level power supply voltage node Q21.

On the other hand, the low voltage level bias supply unit 222 compares the low voltage level reference voltage $V_{refSL}$ of the standby mode and the voltage of the low voltage level power supply voltage node Q23 in the internal circuit 200 and then controls the switching means S22 to generate the standby power supply voltage $V_{SL}$ of a low voltage. The standby power supply voltage $V_{SL}$ of the low voltage level is then applied to the internal circuit 200 and the output buffer 210 through the low voltage level power supply voltage node Q23. Thereby, the width of the level between the high voltage level power supply voltage and the low voltage level power supply voltage in the internal circuit 200 and the output buffer 210 is controlled to be a constant width L21.

At this time, the sixth switching means S26 of the first back bias application unit 241 is not driven by the inverted active control signal ACTB and the fifth switching means S25 is driven by the inverted standby control signal STAB. Thus, the external high voltage level power supply voltage VEXT is applied as a back bias voltage to the well region in which the PMOS transistor of the internal circuit 200 is formed, via the first back bias node Q22, so that the threshold voltage of the PMOS transistor is increased.

Meanwhile, the eighth switching means S28 of the second back bias application unit 242 is driven by the active control signal ACT and the seventh switching means S27 is driven by the standby control signal STA. Thereby, the external low voltage level power supply voltage $V_{SS}$ is applied as a back bias voltage to the well region in which the NMOS transistor of the internal circuit 200 is formed, via the second back bias node Q24, so that the threshold voltage of the NMOS transistor is increased.

The threshold voltages of the PMOS transistor and the NMOS transistor in the internal circuit 200 are increased by the first and second back bias application units 241 and 242. Accordingly, in the standby mode, the amount of current flowing into a region having a voltage lower than the threshold voltage is minimized to lower the static power.

In the active node, an operation of the voltage supply circuit will be now described.

In the active mode, as the standby control signal STA is applied as a LOW level, the standby mode bias supply unit 220 is not driven. However, as the active control signal ACT is applied as a HIGH level, the active mode bias supply unit 230 is driven.

The high voltage level bias supply unit 231 of the active mode bias supply unit 230 compares the high voltage level reference voltage $V_{refAH}$ of the active mode and the voltage of the high voltage level power supply voltage node Q21 in the internal circuit 200 and then controls the switching means S23 to generate the active power supply voltage $V_{AH}$ of a high voltage. The active power supply voltage $V_{AH}$ of the high voltage level is then applied to the internal circuit 200 and the output buffer 210 through the high voltage level power supply voltage node Q21.

On the other hand, the low voltage level bias supply unit 232 compares the low voltage level reference voltage $V_{refAL}$ of the active mode and a voltage of the low voltage level power supply voltage node Q23 in the internal circuit 200 and then controls the switching means S24 to generate the active power supply voltage $V_{AL}$ of a low voltage. The active power supply voltage $V_{AL}$ of the low voltage level is then applied to the internal circuit 200 and the output buffer 210 through the low voltage level power supply voltage node Q23. Thereby, the width of the level between the high voltage level power supply voltage and the low voltage level power supply voltage in the internal circuit 200 and the output buffer 210 is controlled to be a constant width L22.

The width L22 of the level between the high voltage level power supply voltage and the low voltage level power supply voltage that are controlled by the active mode bias supply unit 230, is narrower than the width L21 of the level between the high voltage level power supply voltage and the low voltage level power supply voltage that are controlled by the standby mode bias supply unit 220. Therefore, the dynamic power is reduced since the swing width of the switching means of the internal circuit 200 is reduced.

At this time, the sixth switching means S26 of the first back bias application unit 241 is driven by the inverted active control signal ACTB and the fifth switching means S25 is not driven by the inverted standby control signal STAB.

The active power supply voltage $V_{AH}$ of the high voltage level that is generated from the high voltage level bias supply unit 231 of the active mode bias supply unit 230, is transferred to the first back bias node Q22 by means of a switching operation of the sixth switching means S26. A back bias voltage is thus applied to the well region in which the PMOS transistor of the internal circuit 200 is formed. As a result, the threshold voltage of the PMOS transistor is lowered.

Meanwhile, the eighth switching means S28 of the second back bias application unit 242 is driven by the active control signal ACT and the seventh switching means S27 is not driven by the standby control signal STA.

The active power supply voltage $V_{AL}$ of the low voltage level that is generated from the low voltage level bias supply unit 232 of the active mode bias supply unit 230, is transferred to the second back bias node Q22 by means of a switching operation of the eighth switching means S28 of the low voltage level. A back bias voltage is thus applied to the well region in which the NMOS transistor of the internal circuit 200 is formed. As a result, the threshold voltage of the NMOS transistor is lowered.

As described above, as the threshold voltages of the PMOS transistor and the NMOS transistor are lowered using the first and second back bias application units 241 and 242, the operating speed can be increased even if the levels of the active power supply voltage $V_{AH}$ of the high voltage level and the active power supply voltage $V_{AL}$ of the low voltage level are applied as a small width.

As a result, the operating speed can be improved while reducing the dynamic power using the active mode bias supply unit 230, and the first and second back bias application units 241 and 242.

In the standby mode again, the active mode bias supply unit 230 is not driven and the standby mode bias supply unit 220 is driven. Thus, the external high voltage level power supply voltage VEXT and the low voltage level power supply voltage VSS are each applied to the well region in which the PMOS transistor and the NMOS transistor of the internal circuit 200 are formed. Therefore, the static power can be minimized.

Through the above construction and operation, the operating speed of the circuit can be improved, while minimizing the static power in the standby mode and reducing the dynamic power in the active mode.

Meanwhile, in the active node, the output signals OUT1~OUTn outputted from the internal circuit 200 are swung between the active power supply voltage $V_{AH}$ of the high voltage level and the active power supply voltage $V_{AL}$ of the low voltage level, which are generated from the active mode bias supply unit 230. As a receiving circuit for receiving the output signals operates at a different voltage level, it is required that the signals be matched to the power supply voltage level of the receiving circuit. For this purpose, the voltage supply circuit further includes a level shifter.

A construction and operation of the level shifter will be now described.

Figure 5:
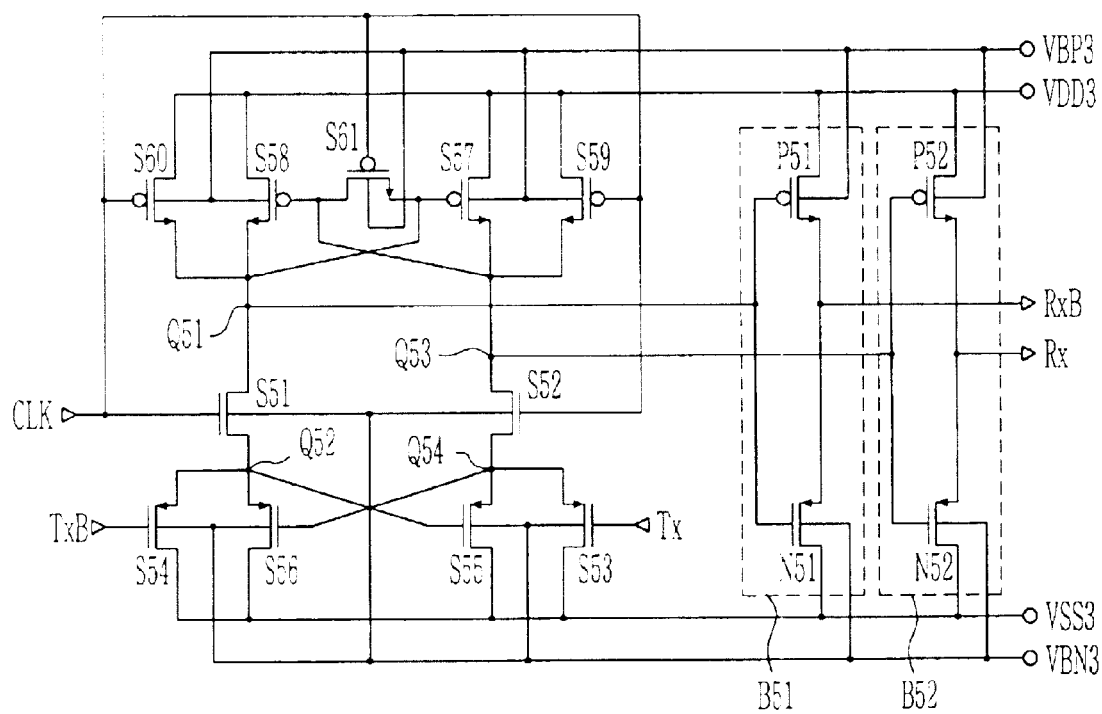
FIG. 5 is a circuit diagram of the voltage supply circuit for explaining a level shifter according to the present invention.

FIG. 5 is a circuit diagram of the level shifter in the voltage supply circuit according to the present invention.

A construction of the level shifter will be first described as follows.

As shown in FIG. 5, the level shifter includes a first switching means S51 connected between a first node Q51 and a second node Q52 and driven by a clock signal CLK, a second switching means S52 connected between a third node Q53 and a fourth node Q54 and driven by the clock signal CLK, a third switching means S53 connected between a fourth node Q54 and a low voltage level power supply voltage terminal VSS3 and driven by an output signal Tx of the internal circuit, a fourth switching means S54 connected between the second node Q52 and the low voltage level power supply voltage terminal VSS3 and driven by an inverted output signal TxB of the internal circuit, a fifth switching means S55 connected between the fourth node Q54 and the low voltage level power supply voltage terminal VSS3 and driven by a voltage level of the second node Q52, a sixth switching means S56 connected between the second node Q52 and the low voltage level power supply voltage terminal Vss and driven by a voltage level of the fourth node Q54, a seventh switching means S57 connected between the third node Q53 and a high voltage level power supply voltage terminal VDD3 and driven by a voltage level of the first node Q51, and an eighth switching means S58 connected between the first node Q51 and the high voltage level power supply voltage terminal VDD3 and driven by a voltage level of the third node Q53.

Further, the level shifter further includes precharge means of the first and third nodes Q51 and Q53 having a ninth switching means S59 connected between the third node Q53 and the high voltage level power supply voltage terminal VDD3 and driven by the clock signal CLK, a tenth switching means S60 connected between the first node Q51 and the high voltage level power supply voltage terminal VDD3 and driven by a voltage level of the clock signal CLK, and an eleventh switching means S61 connected between the first and third nodes Q51 and Q53 and driven by the clock signal CLK.

The precharge means S59~S61 precharge the first and third nodes Q51 and Q53, depending on the clock signal, to improve the operating speed of the circuit, Signals Rx and RxB of the first and third nodes Q51 and Q53 being output nodes are outputted as a stabilized signal through first and second output buffers B51 and B52. At this time, the first output buffer B51 is serially connected between the high voltage level power supply voltage terminal VDD3 and the low voltage level power supply voltage terminal VSS3. The first output buffer B51 has a PMOS transistor P51 and a NMOS transistor N51 to which the voltage of the first node Q51 is applied. Also, the second output buffer B52 is serially connected between the high voltage level power supply voltage terminal VDD3 and the low voltage level power supply voltage terminal VSS3. The second output buffer B52 has a PMOS transistor P52 and a NMOS transistor N52 to which a voltage of the third node Q53 is applied.

A first back bias VBP3 is applied to the well region in which the switching means S57~S61, P51 and P52 having the PMOS transistors in the above construction are formed. A second back bias voltage VBN3 is applied to the well region in which the switching means S51~S56, N51 and N52 having the NMOS transistors are formed.

An operation of the level shifter constructed above will be below described.

If the clock signal CLK is applied as a LOW level, the first and second switching means S51 and S52 are not driven but the ninth~eleventh switching means S59~S61 are driven. The first and third nodes Q51 and Q53 are thus charged by means of the switching operation of the ninth~eleventh switching means S59~S61.

On the other hand, if the clock signal CLK is applied as a HIGH level, the ninth~eleventh switching means S59~S61 are not driven but the first and second switching means S51 and S52 are driven. At this time, only one of the third and fourth switching means S53 and S54 is driven by the signal Tx generated from the output buffer 210 in FIG. 2 and its inverted signal TxB.

For example, if the signal Tx is applied as a HIGH level, the fourth switching means S54 is not driven but the third switching means S53 is driven. Also, the low voltage level power supply voltage VSS3 is applied to the fourth node Q54 by means of the switching operation. The low voltage level power supply voltage VSS3 applied to the fourth node Q54 is applied to the third node Q53 by means of the switching operation of the second switching means S52. The eighth switching means S58 is thereby driven, so that the high voltage level power supply voltage VDD3 is applied to the first node Q51. On the other hand, the high voltage level power supply voltage VDD3 applied to the first node Q51 being the output node is outputted as the output signal RxB that is inverted through the first output buffer B51. Also, the low voltage level power supply voltage VSS3 applied to the third node Q53 is outputted as the output signal Rx through the second output buffer B52.

By the above operation, the HIGH level of the output signal generated from the internal circuit 200 in FIG. 2 is controlled to be the level of the high voltage level power supply voltage VDD3 of the receiving circuit, and the LOW level thereof is controlled to be the level of the low voltage level power supply voltage VSS3.

If the signal Tx is applied as a LOW level, the LOW level of the output signal generated from the internal circuit 200 in FIG. 2 is controlled to be the level of the high voltage level power supply voltage VDD3 of the receiving circuit, and the HIGH level thereof is controlled to be the level of the low voltage level power supply voltage VSS3.

As mentioned above, according the present invention, in a standby mode, a threshold voltage of a transistor is raised to minimize the amount of current flowing at a voltage below the threshold voltage. In an active node, on the other hand, the width of a level between a high voltage level power supply voltage and a low voltage level power supply voltage is reduced and the threshold voltage of the transistor is simultaneously lowered, so that the operating speed is improved. Therefore, the present invention has outstanding advantages that it can implement a circuit of a high operating speed with low power consumption using a high-speed operating device of a low power and can be thus applied to mobile communication devices such as Bluetooth, IMT-2000, and the like.

Further, according to the present invention, ground bouncing is controlled by adjusting the threshold voltage of the transistor. Therefore, the present invention has advantages that it can improve the stability of an operation and can implement a device having multi-level threshold voltages without additional mask in the process.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A voltage supply circuit, comprising:
a circuit that operates separately in a standby mode and in an active mode; a standby mode bias supply unit that controls an external high voltage level power supply voltage and an external low voltage level power supply voltage to be a first target high voltage and a first target low voltage, depending on a standby control signal if the circuit is in the standby mode, and then supplies the first target high voltage and the first target low voltage to the circuit; and
an active mode bias supply unit generating a second target high voltage lower than the first target high voltage and a second target low voltage higher than the first target low voltage, depending on an active control signal if the circuit is in the active mode, and then supplies the second target high voltage and the second target low voltage to the circuit,
wherein the standby mode bias supply unit comprises a high voltage level bias supply unit that controls the external high voltage level power supply voltage to be the first target high voltage, and a low voltage level bias supply unit that controls the external low voltage level power supply voltage to be the first target low voltage, the low voltage level bias supply unit comprising a first switching means connected between an external low voltage level power supply voltage terminal and a first output terminal connected to a first input terminal of the circuit, and a first compare means for comparing a voltage of the first output terminal and a reference low voltage level power supply voltage of the standby mode to control the first switching means, depending on the standby control signal.

2. The voltage supply circuit as claimed in claim 1, wherein the high voltage level bias supply unit comprises:
a second switching means connected between an external high voltage level power supply voltage terminal and a second output terminal connected to a second input terminal of the circuit; and
a second compare means for comparing a voltage of the second output terminal and a reference high voltage level power supply voltage of the standby mode to control the second switching means, depending on the standby control signal.

3. A voltage supply circuit, comprising:
a circuit that operates separately in a standby mode and in an active mode;
a standby mode bias supply unit that controls an external high voltage level power supply voltage and an external low voltage level power supply voltage to be a first target high voltage and a first target low voltage, depending on a standby control signal if the circuit is in the standby mode, and then supplies the first target high voltage and the first target low voltage to the circuit; and
an active mode bias supply unit including a high voltage level bias supply unit and a low voltage level bias supply unit, said active mode bias supply unit generating a second target high voltage lower than the first target high voltage and a second target low voltage higher than the first target low voltage, depending on an active control signal if the circuit is in the active mode, and then supplies the second target high voltage and the second target low voltage to the circuit,
wherein said
low voltage level bias supply unit includes a first switching means connected between an external low voltage level power supply voltage terminal and a first output terminal connected to a first input terminal of the circuit, and a first compare means for comparing a voltage of the first output terminal and a reference low voltage level power supply voltage of the active mode to control the first switching means, depending on the active control signal.

4. The voltage supply circuit as claimed in claim 3, wherein the high voltage level bias supply unit comprises:
a second switching means connected between an external high voltage level power supply voltage terminal and a second output terminal connected to a second input terminal of the circuit; and
a second compare means for comparing a voltage of the second output terminal and a reference high voltage level power supply voltage of the active mode to control the second switching means, depending on the active control signal.

5. A voltage supply circuit, comprising:
a circuit that operates separately in a standby mode and in an active mode;
a standby mode bias supply unit that controls an external high voltage level power supply voltage and an external low voltage level power supply voltage to be a first target high voltage and a first target low voltage, depending on a standby control signal if the circuit is in the standby mode, and then supplies the first target high voltage and the first target low voltage to the circuit;
an active mode bias supply unit generating a second target high voltage lower than the first target high voltage and a second target low voltage higher than the first target low voltage, depending on an active control signal if the circuit is in the active mode, and then supplies the second target high voltage and the second target low voltage to the circuit;
a first back bias application unit for applying either the external high voltage level power supply voltage or the second target high voltage generated from the active mode bias supply unit to a back bias terminal of a PMOS transistor in the circuit, depending on an inverted standby control signal and an inverted active control signal; and
a second back bias application unit for applying either the external low voltage level power supply voltage or the second target low voltage generated from the active mode bias supply unit to a back bias terminal of a NMOS transistor in the circuit, depending on the standby control signal and the active control signal.

6. The voltage supply circuit as claimed in claim 5, wherein the first back bias application unit comprises:
a first switching means connected between the back bias terminal of the PMOS transistor and an external high voltage level power supply voltage terminal and driven by the inverted standby control signal, and
a second switching means connected between the back bias terminal of the PMOS transistor and a first output terminal of the active mode bias supply unit and driven by the inverted active control signal.

7. The voltage supply circuit as claimed in claim 6, wherein the second back bias application unit comprises:
a third switching means connected between the back bias terminal of the NMOS transistor and an external low voltage level power supply voltage terminal and driven by the standby control signal, and a fourth switching means connected between the back bias terminal of the NMOS transistor and a second output terminal of the active mode bias supply unit and driven by the active control signal.

8. A voltage supply circuit, comprising:

a circuit that operates separately in a standby mode and in an active mode;

a standby mode bias supply unit that controls an external high voltage level power supply voltage and an external low voltage level power supply voltage to be a first target high voltage and a first target low voltage, depending on a standby control signal if the circuit is in the standby mode, and then supplies the first target high voltage and the first target low voltage to the circuit;

an active mode bias supply unit generating a second target high voltage lower than the first target high voltage and a second target low voltage higher than the first target low voltage, depending on an active control signal if the circuit is in the active mode, and then supplies the second target high voltage and the second target low voltage to the circuit; and a level shifter for controlling an output signal of the circuit to be a power supply voltage level of a receiving circuit connected to the circuit, in the active mode, and then applying the output signal to the receiving circuit, wherein the level shifter comprises:

a first switching means connected between a first node and a second node and driven by a clock signal;

a second switching means connected between a third node and a fourth node and driven by the clock signal;

a third switching means connected between the fourth node and the low voltage level power supply voltage terminal of the level shifter and driven by the output signal of the circuit;

a fourth switching means connected between the second node and the low voltage level power supply voltage terminal of the level shifter and driven by an inverted output signal of the circuit;

a fifth switching means connected between the fourth node and the low voltage level power supply voltage terminal of the level shifter and driven by a voltage level of the second node;

a sixth switching means connected between the second node and the low voltage level power supply voltage terminal of the level shifter and driven by a voltage level of the fourth node;

a seventh switching means connected between the third node and the high voltage level power supply voltage terminal of the level shifter and driven by a voltage level of the first node; and an eighth switching means connected between the first node and the high voltage level power supply voltage terminal of the level shifter and driven by a voltage level of the third node.

9. The voltage supply circuit as claimed in claim 8, wherein the level shifter further comprises a precharge means of the first and third nodes having:

a ninth switching means connected between the third node and the high voltage level power supply voltage terminal of the level shifter and driven by the clock signal;

a tenth switching means connected between the first node and the high voltage level power supply voltage terminal of the level shifter and driven by the clock signal; and an eleventh switching means connected between the first and third nodes and driven by the clock signal.

* * * * *